Sept. 5, 1967 B. A. MacIVER ETAL 3,339,272

METHOD OF FORMING CONTACTS IN SEMICONDUCTOR DEVICES

Filed May 28, 1964

INVENTORS
Bernard A. Mac Iver
James W. Bergstrom

BY T. J. Soucek
Attorney

United States Patent Office 3,339,272

Patented Sept. 5, 1967

3,339,272

METHOD OF FORMING CONTACTS IN SEMICONDUCTOR DEVICES

Bernard A. MacIver, Detroit, and James W. Bergstrom, Troy, Mich., assignors to General Motors Corporation, Detroit, Mich., a corporation of Delaware Filed May 28, 1964, Ser. No. 370,983
3 Claims. (Cl. 29—571)

ABSTRACT OF THE DISCLOSURE

In preferred form this disclosure pertains to a method of forming a rectifying contact between a large area metallic electrode and a semiconductive channel. This method utilizes the heating effect of a controlled current passing through the conducting channel, rather than the application of external heat, to form the rectifier contact. More specifically, the subject method comprises the steps of applying first and second ohmic contacts to the conducting channel, depositing a metal contact on the conducting channel intermediate the ohmic contacts, connecting a reverse bias voltage source between the metal contact and the second ohmic contact, connecting a voltage source between the first and second ohmic contacts, and passing current through the conducting channel to heat a localized area beneath the metal contact to form a rectifying barrier alloy layer at the interface of the metal contact and the conducting channel which causes a space charge region to form in the channel. The application of the voltage is discontinued when the current from both sources is substantially zero.

The present invention relates generally to semiconductor devices, and more particularly to a method of forming rectifier contacts in thin semiconductive regions of semiconductor devices.

Various techniques have been employed to form rectifier contacts in semiconductor devices. These techniques include alloying different types of semiconductive materials, and the diffusion of semiconductive material of one conductivity type into a semiconductor surface of opposite conductivity type.

A field effect transistor is generally made by providing an ohmic semiconductive channel on a body of insulating semiconductor material to form a thin region of given conductivity on the body. Ohmic contacts are connected to the channel to provide source and drain electrodes, and a rectifying contact is connected to the conducting channel to form a gate electrode. The gate electrode provides a space charge in the conducting channel and controls the current flow between the source and drain electrodes in a manner well known in the art of field effect transistors.

In accordance with the present invention, a rectifying contact is formed between a large area metallic electrode and a semiconductive channel. In our previous investigations it was noted that the rectifying contact may be formed when the contact is reverse biased relative to the surface, and heat is applied in the region of the interface. The method, in accordance with the present invention, utilizes the heating effect of a controlled current passing through the conducting channel, rather than the application of external heat, to form the rectifier contact between the metal electrode and the semiconductive conducting channel. The use of this method eliminates the need of an external heat source and permits precise control of the heating effect produced by an electrical current to form a rectifying region.

An object of the present invention is to provide a method for forming rectifying contacts in a thin semiconductive region.

Another object is to provide an improved rectifier contact between a metal electrode and a semiconductive conducting channel.

A further object is to facilitate production of a rectifier contact in a field effect transistor by utilizing the heating effect of an applied electric current.

Figure 1:
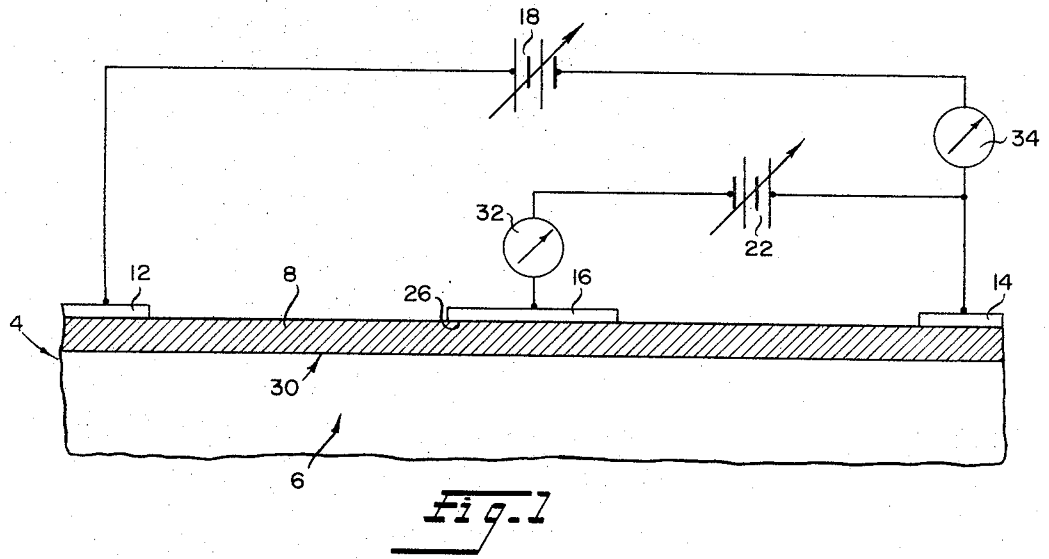
Figure 2:
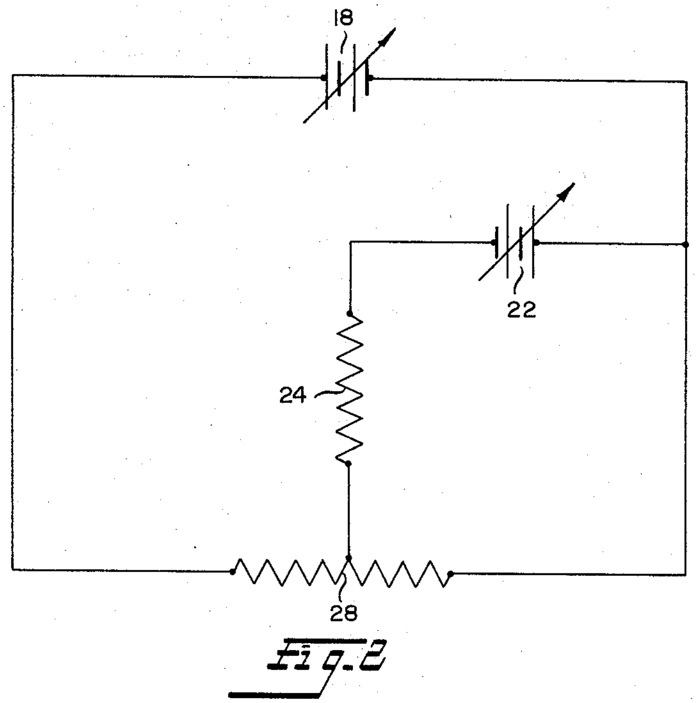

These and other objects of the present invention will become more apparent from the following description relating to the accompanying drawing in which:

FIGURE 1 is a circuit diagram including a cross sectional view of a semiconductor device and illustrating one arrangement for carrying out the present invention; and, FIGURE 2 is an electrical circuit diagram including a representation of the internal impedances of the device of FIGURE 1.

Referring now to FIGURE 1, the semiconductor device 4, which is a field effect transistor, includes an insulating semiconductor body 6 of a material such as cadmium sulfide or the like and a doped semiconductor conducting channel 8 which is formed by conventional techniques on the body 6. For example, the cadmium sulfide body 6 may be doped with indium to form the thin ohmic region comprising the conducting channel 8. First and second ohmic contacts 12 and 14, respectively, are secured to the conducting channel in a conventional manner. Contacts 12 and 14 comprise the source and drain electrodes of the semiconductor device. In the area where a rectifying contact is desired, a large area metal contact 16 is fixed to the conducting channel. The contact 16 provides the gate electrode. Satisfactory results have been obtained in forming the metal contact 16 by vacuum depositing tellurium on the conducting channel 8.

Voltage sources 18 and 22 are connected to the contacts and are required to supply current to form a rectifying region adjacent the metal contact 16. Source 18 is connected between the two ohmic contacts 12 and 14, and source 22 is connected between the metal contact 16 and one ohmic contact, for example, 14. The voltage sources 18 and 22 are preferably variable as utilized in the method described hereinbelow.

The voltage source 22 is connected to provide a reverse bias between the metal contact 16 and ohmic contact 14. The reverse biasing is established with reference to the conductivity of conducting channel 8 which has a given conductivity characteristic depending upon the characteristic of the semiconductive material used to form the conducting channel. In FIGURE 1, the positive terminal of source 22 is shown connected to contact 14 and the negative terminal is connected to the metal contact 16. The positive terminal of source 18 is connected to ohmic contact 12 and the negative terminal is connected to ohmic contact 14. It is understood that the battery polarities may be changed but it is necessary to maintain the metal contact 16 reverse biased relative to the conducting channel 8 to obtain the desired results.

In FIGURE 2 the resistance 24 represents the reverse resistance established at the metal to semiconductor interface 26, the interface 26 being formed by the deposition of the metal contact 16 on the conducting channel 8 as described hereinabove. The resistance 28 represents the effective resistance of the conducting channel 8 between ohmic contacts 12 and 14.

To form a rectifying contact at the interface 26 in accordance with the present invention, the voltage sources are connected to the ohmic contacts 12 and 14 and metal contact 16 as described hereinabove. In applying the voltage sources to supply the required current, the voltage of source 18 only, or of both sources 18 and 22, is increased until the heat generated by the current at the metal to semiconductor interface 26 and in the conducting channel 8 is more than the effective resistances 24 and 28 can dissipate. At this time the heating effect of the applied current begins to concentrate at the metal to semiconductor interface 26, causing the reverse resistance 24 to become increasingly resistive. Localizing the heating effect of the applied current is inherent and provides the precise control of applied heat in applicants' method. The voltage from source 22 is increased and the heating effect causes the resistance 24 to increase to an effective value higher than the resistance 28. Voltage from source 22 is increased and the increased resistance 24 causes the current applied through the metal contact 16 to start to decrease because of the formation of a space charge or depletion region in the conducting channel adjacent the metal contact 16. The space charge tends to further limit the current applied by the sources 18 and 22, causing an effective increase in resistance 28. With the voltage of sources 18 and 22 constant, current is reduced to a value such that the power applied is negligible when the space charge or depletion region extends from the metal contact 16 through the channel 8 to the boundary 30 between the channel 8 and semiconductor body 6, at which time the process is completed.

The process is inherently self-regulating, since the current from the two sources becomes negligible because the resistances 24 and 28 are sufficiently high to prevent current flow at the completion of the process. The current flow may be measured by suitable meters, such as conventional ammeters as shown at 32 and 34. The described process results in forming a rectifying region in the conducting channel 8 directly beneath the metallic contact 16, thereby producing a rectifying or gate electrode. The heating occurring at the interface 26 also further secures the contact 16 to the conducting channel 8 by alloying the metal contact and conducting channel materials.

In a specific application of this invention, the voltage sources 18 and 22 were connected as described above and the source 18 was adjusted to six volts. The measured current flow into contact 14 was 25 milliamperes, indicating a power dissipation of 150 milliwatts in the conducting region 8 between the ohmic contacts 12 and 14. The 150 milliwatts is approximately the power required to form the rectifying contact at metal contact 16 when external heat is applied at the metal contact interface using previous methods. Since the current supplied by source 18 was dissipated throughout the conducting channel, additional power was required from the voltage source 22. The source 22 was adjusted to 8 volts which resulted in a measured current flow of 25 milliamperes flowing into the metal contact 16. The additional current from source 22 resulted in additional heat being generated at the interface 26 between the metal electrode 16 and conducting channel 8. The heating effect of the current supplied from the voltage source 18 localized and increased in the region beneath the metal contact 16 and also started the formation of a depletion region adjacent the metal contact. The resistance 24 of the contacting channel between the metal contact and the remaining portion of the conducting channel increased, due to the formation of the depletion region. The heating effect of the current supplied by both the voltage sources 18 and 22 was then localized in the region beneath the metal contact 16. When the depletion region extended through the conducting channel from the metal contact 16 to the opposite boundary 30 of the conducting channel, the localized heating began to decrease. The decreased heating effect resulted from the greatly decreased current flow, due to the high resistance portion formed in the conducting channel by the depletion region. The current from the source 18 became zero and the current from the voltage source 22 was substantially zero, or only a few microamperes.

The process forming the rectifying junction of metal contact 16 is completed when the value of the currents supplied by the voltage sources 18 and 22 decreases to a minimum. It is understood that the values of the voltages and currents required in application of this method may vary when different semiconductive materials are used in the conducting channel 8 and other metals are used for the contact 16.

What is claimed is:

1. A method for forming a rectifying contact in a conducting channel provided on a body of insulating semiconductive material comprising the steps of, applying first and second ohmic contacts to said conducting channel, placing a large area metal contact on said conducting channel, connecting a reverse bias voltage source between said metal contact and said second ohmic contact, connecting a second voltage source between said first and said second ohmic contacts, applying sufficient current from said sources so that current produced heat begins to localize in the area of the metallic contact, applying additional current from said reverse bias source whereby increased heat concentration in the region of the conducting chanel adjacent the metal contact causes a rectifying barrier alloy layer to form at their interface, which thereupon causes a space charge region to be formed in said channel, and continuing application of said voltage sources until the current through the metal contact and the second contact decreases to approximately zero, and the current through the first and second contact reduces to zero, the current decreases resulting from the formation of said space charge region through said conducting channel.

2. A method for forming a rectifying contact in a field effect transistor conducting channel formed by deposition of indium on a cadmium sulfide insulating semiconductive body comprising the following steps:

applying first and second ohmic contacts to the conducting channel, depositing a tellerium metal contact on said conducting channel intermediate said ohmic contacts where a rectifying contact is desired, connecting a reverse bias voltage source between said metal contact and said second ohmic contact, connecting a voltage source between said first and said second ohmic contacts, and passing current through said conducting channel from said voltage sources whereby the heating effect of the current localizes at an area beneath said metal contact and forms a rectifying barrier alloy region at the interface and creates a space charge region extending through said channel to the semiconducting body when the current from said two sources is substantially zero.

3. A method for forming a rectifying contact in a conducting channel of a field effect transistor formed by doping an insulating semiconductive body of cadmium sulfide with indium, the method comprising the steps of, applying first and second ohmic contacts to the conducting channel, depositing a tellerium metal contact on said conducting channel intermediate said ohmic contacts, connecting a reverse bias voltage source between said metal contact and said second ohmic contact whereby the positive terminal of said reverse bias voltage source is connected to said second ohmic contact and the negative terminal is connected to said metal contact, connecting a second voltage source between said first and second ohmic contacts whereby the positive terminal of said second voltage source is connected to said first ohmic contact and the negative terminal is connected to said second ohmic contact, applying approximately six volts from said second voltage source to said first and second ohmic contacts, and applying approximately eight volts from said reverse bias voltage source to said metal contact and the second ohmic contact, and maintaining the voltage of said sources until the current flow at said second contact and said metal contact is substantially decreased, the heat produced by said current flow causing a rectifying barrier alloy layer to form at the metal contact and channel interface, which in turn causes a space charge region to form in said conducting channel adjacent said metal contact.

References Cited

UNITED STATES PATENTS

| | | | |
|---|---|---|---|
| 2,750,542 | 6/1956 | Armstrong | 29—25.3 X |
| 2,856,320 | 10/1958 | Swanson | 148—183 |
| 3,056,888 | 10/1962 | Atalla. | |
| 3,062,972 | 11/1962 | Spector | 317—235 X |

WILLIAM I. BROOKS, *Primary Examiner.*